(12) United States Patent
White et al.

(10) Patent No.: US 11,865,535 B2
(45) Date of Patent: Jan. 9, 2024

(54) MICROFLUIDIC REACTION SYSTEM (71) Applicant: HEWLETT-PACKARD DEVELOPMENT COMPANY, L.P., Spring, TX (US)

(72) Inventors: Rachel M. White, Corvallis, OR (US); Uranbileg Daalkhaijav, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 728 days.

(21) Appl. No.: 16/493,694

(22) PCT Filed: Jul. 28, 2017

(86) PCT No.: PCT/US2017/044543
§ 371 (c)(1),
(2) Date: Sep. 12, 2019

(87) PCT Pub. No.: WO2018/194700
PCT Pub. Date: Oct. 25, 2018

(65) Prior Publication Data
US 2020/0023355 A1 Jan. 23, 2020

(30) Foreign Application Priority Data

Apr. 20, 2017 (WO) ............... PCT/US2017/028574
Apr. 20, 2017 (WO) ............... PCT/US2017/028586

(51) Int. Cl.
*B01L 3/00* (2006.01)
*B81B 7/00* (2006.01)

(52) U.S. Cl.
CPC ............. *B01L 3/5027* (2013.01); *B81B 7/00* (2013.01); *B01L 2200/16* (2013.01);
(Continued)

(58) Field of Classification Search
CPC ........ C12Q 2565/629; C12Q 2565/607; G01N 33/5438; G01N 15/0266; G01N 15/1484;
(Continued)

(56) References Cited

U.S. PATENT DOCUMENTS 3,963,355 A * 6/1976 Aldridge, Jr ............. C12Q 1/04
435/304.2
5,504,011 A * 4/1996 Gavin .................... G01N 33/86
600/576

(Continued)

FOREIGN PATENT DOCUMENTS

CN 104855671 8/2015
EP 2046498 11/2011
(Continued)

OTHER PUBLICATIONS

Dittrich; "An Integrated Microfluidic System for Reaction, High-Sensitivity Detection, and Sorting of Fluorescent Cells and Particles"; Anal. Chem.; Sep. 16, 2003.
(Continued)

*Primary Examiner* — Dean Kwak
(74) *Attorney, Agent, or Firm* — Foley & Lardner LLP (57) ABSTRACT

A microfluidic reaction system may include a microfluidic die having a microfluidic volume, a port connected to the microfluidic volume for receiving a fluid and a freeze-dried reaction agent coating at least a portion of the microfluidic volume.

20 Claims, 4 Drawing Sheets

(52) U.S. Cl.
CPC .............. *B01L 2300/0645* (2013.01); *B01L 2300/1827* (2013.01); *B01L 2400/0442* (2013.01)

(58) Field of Classification Search
CPC ... G01N 2015/1006; G01N 2015/1493; G01N 27/02; G01N 33/49; G01N 33/4905; G01N 33/86; G01N 11/04; G01N 11/06; G01N 15/1031; G01N 15/12; G01N 15/1404; G01N 15/1429; G01N 15/1431; G01N 15/1459; G01N 2011/002; G01N 2015/0065; G01N 2015/1486; G01N 2035/00881; G01N 21/7703; G01N 27/06; G01N 27/12; G01N 33/4915; G01N 33/561; G01N 33/6893; G01N 35/00871; B01L 2300/0816; B01L 2300/0867; B01L 2400/0442; B01L 9/527; B01L 2300/0645; B01L 2300/1827; B01L 3/5027; B01L 3/502715; B01L 2200/147; B01L 3/50273; B01L 2200/10; B01L 2200/16; B01L 2300/023; B01L 2300/0636; B01L 2300/0663; B01L 2300/0864; B01L 2400/0406; B01L 3/502707; B01L 7/00; B01L 7/52; B81B 7/00
USPC ....... 422/68.1, 73, 82.01, 82.02, 82.03, 224; 422/500–504, 554; 436/8, 10, 63, 69, 436/149, 150, 151; 73/64.41; 600/369
See application file for complete search history.

(56) References Cited

U.S. PATENT DOCUMENTS

| | | | |
|---|---|---|---|
| 6,046,051 A | 4/2000 | Jina | |
| 7,459,022 B2 | 12/2008 | Hansen et al. | |
| 7,605,002 B2 | 10/2009 | Summersgill | |
| 8,691,164 B2 | 4/2014 | Butler et al. | |
| 8,790,932 B2 | 7/2014 | Augstein et al. | |
| 9,108,195 B2 | 8/2015 | Herr et al. | |
| 2002/0079219 A1 | 6/2002 | Zhao | |
| 2004/0072357 A1 | 4/2004 | Stiene et al. | |
| 2004/0147032 A1 | 7/2004 | Martin | |
| 2005/0175505 A1* | 8/2005 | Cantor | B01L 3/502707 422/68.1 |
| 2006/0233674 A1 | 10/2006 | Nelson | |
| 2007/0128083 A1 | 6/2007 | Yantz | |
| 2007/0280857 A1 | 12/2007 | Song et al. | |
| 2007/0292941 A1* | 12/2007 | Handique | B01L 7/52 435/287.1 |
| 2008/0318260 A1 | 12/2008 | Mpock et al. | |
| 2009/0053732 A1 | 2/2009 | Vermesh et al. | |
| 2009/0056425 A1 | 3/2009 | Ruefer et al. | |
| 2010/0112717 A1 | 5/2010 | Augstein et al. | |
| 2011/0039285 A1 | 2/2011 | Sadaba | |
| 2012/0107851 A1 | 5/2012 | Killard | |
| 2012/0171662 A1* | 7/2012 | Broyer | B01L 3/0217 435/6.12 |
| 2012/0301371 A1 | 11/2012 | Aigstein et al. | |
| 2013/0011332 A1 | 1/2013 | Boyden | |
| 2014/0376816 A1 | 12/2014 | Lagae et al. | |
| 2015/0056643 A1 | 2/2015 | Sniadecki | |
| 2015/0247790 A1 | 9/2015 | Okumus et al. | |
| 2015/0367016 A1 | 12/2015 | Gruenbacher | |
| 2016/0069913 A1 | 3/2016 | Bakhru et al. | |
| 2017/0014826 A1 | 1/2017 | Engel | |
| 2017/0080424 A1 | 3/2017 | Di Fabrizio | |
| 2017/0328882 A1 | 11/2017 | Valencia | |
| 2018/0003614 A1 | 1/2018 | Sait M. A. | |

FOREIGN PATENT DOCUMENTS

| | | |
|---|---|---|
| EP | 2439530 A1 | 4/2012 |
| TW | 201629485 | 8/2016 |
| WO | WO-0006761 A1 | 2/2000 |
| WO | WO-2016122559 A1 | 8/2016 |

OTHER PUBLICATIONS

Fernando; "PT/INR Test Performance of the Xprecia Stride Coagulation Analyzer on Capillary Blood is Equivalent to a Reference Laboratory Hemostasis System"; 2015.

Mabe; "Smart and Autonomous Medical Devices: MicroINR—Point of Care Autonomous Device for Blood Clotting Monitoring"; IK4 Tekniker Research Alliance; EPOSS Annual Forum 2015.

Rossinelli; The In-silico Lab-on-a-chip: Petascale and High-Throughput Simulations of Microfluidics at Cell Resolution; Nov. 15-20, 2015.

Smith; "Lyophilized *Escherichia coli*-based cell-free systems for robust, high-density, long-term storage"; BioTechniques; vol. 56, No. 4; Apr. 2014; pp. 186-193.

* cited by examiner

MICROFLUIDIC REACTION SYSTEM

BACKGROUND

Reaction agents are sometimes used with samples to provide or invoke a response to determine a characteristic of the sample. For example, reaction agents may target a specific biological or chemical presence, wherein the response of the sample to interrogation may indicate the presence or absence of the targeted biological or chemical element. Such reaction agents may be utilized as part of a screening assay in the field or at the point of care by clinicians.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DETAILED DESCRIPTION OF EXAMPLES

Testing samples through the use of reaction reagents is often carried out in a laboratory on a relatively large scale, utilizing relatively large samples, large amounts of reaction reagents and expensive testing equipment. Performing such testing on a smaller scale, such as a microfluidic scale to reduce sample size and reduce cost presents many challenges. Thorough mixing of the sample and the reaction agent at the time of testing may be difficult given the smaller scale. Moreover, such reaction agents may not be stable at room temperature and may have a relatively short shelf life.

Disclosed herein are example microfluidic reaction systems and methods that provide for such testing on a microfluidic scale to reduce sample size and reduce cost. Disclosed herein are example microfluidic reaction systems that contain a freeze-dried reaction agent that coats at least a portion of the microfluidic internal volume of a microfluidic die. The freeze-dried reaction agent has enhanced stability at room temperature and may have an enhanced shelf life. Moreover, the freeze-dried reaction agent, as a relatively thin coating on the interior surfaces of the microfluidic internal volume, may be wetted with a sample at the time of testing for use with little or no mixing. As a result, the disclosed microfluidic reaction systems and methods provide a ready to use diagnostic device that may provide enhanced performance at a lower cost.

Disclosed herein is an example microfluidic reaction system that may include a microfluidic die comprising a microfluidic volume, a port connected to the microfluidic volume for receiving a fluid and a freeze-dried reaction agent coating at least a portion of the microfluidic volume.

Disclosed herein is an example method for forming a microfluidic reaction system. The method may include forming a microfluidic volume in a microfluidic die, introducing a reaction agent into the microfluidic volume and freeze-drying the reaction agent within the microfluidic volume.

Disclosed herein is an example microfluidic reaction system that may include microfluidic die comprising a microfluidic volume, a port connected to the microfluidic volume for receiving a fluid, a heater supported by the microfluidic die to heat fluid in the volume and a freeze-dried reaction agent coating at least a portion of the microfluidic volume. The freeze-dried reaction agent may comprise one of an optical indicator and an electrochemical detection agent.

Some example microfluidic dies comprise microfluidic channels or microfluidic volumes. Microfluidic channels may be formed by performing etching, microfabrication (e.g., photolithography), micromachining processes, or any combination thereof in a substrate of the fluidic die. Some example substrates may include silicon based substrates, glass based substrates, gallium arsenide based substrates, and/or other such suitable types of substrates for microfabricated devices and structures. In some implementations, such microfluidic channels or volumes may be formed by photoresist materials formed or patterned on a substrate. One example of such photoresist materials is SU8, an epoxy based photoresist material. The microfluidic channels, chambers, orifices, and/or other such features may be defined by surfaces fabricated in the substrate of a fluidic die. Furthermore, as used herein a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.). Example fluidic dies described herein may comprise microfluidic channels in which fluidic actuators may be disposed. In such implementations, actuation of a fluid actuator disposed in a microfluidic channel may generate fluid displacement in the microfluidic channel. Accordingly, a fluid actuator disposed in a microfluidic channel may be referred to as a fluid pump.

Disclosed herein are various examples of microfluidic components supported by microfluidic dies. Examples of such microfluidic components include microfluidic valves, microfluidic pumps, electrodes, fluid actuators and heaters. It should be appreciated that each of such components receives electrical power via electrically conductive wires or electrically conductive traces provided on microfluidic die which form an electrical circuit for selectively supplying electrical current to drive such components. Such components may be controlled by controller located on the microfluidic die or off of the microfluidic die via control signals, wherein such components may be actuated through the supply or discontinued supply of power using one or more electrical switches, such as thin film transistors, located on the microfluidic die.

Figure 1:
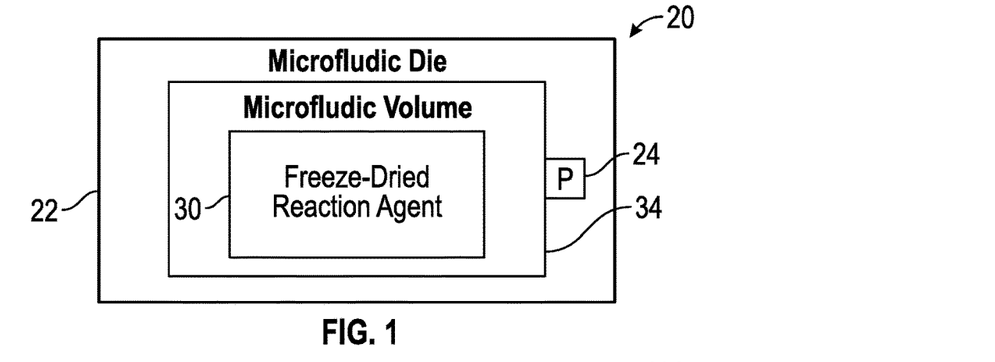
FIG. 1 is a schematic diagram of portions of an example microfluidic reaction system.

FIG. 1 schematically illustrates portions of an example microfluidic reaction system 20. Microfluidic reaction system 20 provides for testing on a microfluidic scale to reduce sample size and reduce cost. As will be described hereafter, system 20 contains a freeze-dried reaction agent that coats at least a portion of the microfluidic internal volume of a microfluidic die. The freeze-dried reaction agent has enhanced stability at room temperature and may have an enhanced shelf life. Moreover, the freeze-dried reaction agent, as a relatively thin coating on the interior surfaces of the microfluidic internal volume, may be wetted with a sample at the time of testing for use with little or no mixing. As a result, microfluidic reaction system 20 provides a ready to use diagnostic device that may provide enhanced performance at a lower cost. Microfluidic reaction system 20 comprises microfluidic die 22, port 24 and a freeze-dried reaction agent 30.

Microfluidic die 22 comprises a body comprising a microfluidic volume 34. Microfluidic volume 34 may comprise a microfluidic channel or passage, a reservoir, a slot or combinations thereof. Microfluidic volume 34 may include different portions, such as different passages, chambers, slots and the like which are fluidly coupled to one another or which may be fluidly coupled to one another through the actuation of valves of the like. The term "fluidly coupled" shall mean that two or more fluid transmitting or containing volumes are connected directly to one another or are connected to one another by intermediate volumes or spaces such that fluid may flow from one volume into the other volume.

In one implementation, microfluidic volume 34 is formed directly in a substrate such as silicon based substrates, glass based substrates, gallium arsenide based substrates, and/or other such suitable types of substrates for microfabricated devices and structures. In another implementation, microfluidic volume 34 may be formed in at least one layer formed on such a substrate. For example, in some implementations, microfluidic volume may be formed by photo patterned photoresist materials such as epoxy based photoresists. Microfluidic volume 34 may have a variety of sizes, shapes and layouts depending upon the testing to be carried out by system 20.

Port 24 comprises an inlet or passage by which a sample may be introduced into microfluidic volume 34. In one implementation, port 24 may comprise a slot. In another implementation, port 24 may comprise an opening through which a needle or syringe may deposit a fluid sample. In another implementation, poor 24 may comprise an opening for connection to a fluid conduit for the introduction of a sample.

Freeze-dried reaction agent 30 comprises a chemical or biological material that is to provide a response or invoke a response through direct or indirect interaction with a targeted biological or chemical element. Freeze-dried reaction agent 30 is introduced into at least portions of microfluidic volume 34 as a fluid and subsequently freeze-dried to form a dry layer coating on portions of the interior surface of microfluidic volume 34. Freeze-dried reaction agent 30 has a composition such that when contacted or wetted by a fluid sample, freeze-dried reaction agent 30 is absorbed into the fluid, becoming active for testing characteristics of the introduced fluid sample.

Freeze-dried reaction agent 30 may have various chemical or biological compositions depending upon the sample being tested, the targeted biological or chemical element, the nature of the response produced by or invoked by the reaction agent 30 and the type of sensor utilized to sensor detect the response. In one implementation, freeze-dried reaction agent 30 comprises a lyophilized) protein reagent or tissue factor which reacts with plasma when wetted with a blood sample to test coagulation properties of the blood sample.

In another implementation, freeze-dried reaction agent comprises an optical indicator in the form of at least one chemical that optically indicates, to an optical sensor, the presence of the targeted ionic species or the ionic byproducts produced by the ionic species of a sample during its multiplication or amplification. The optical indicator may target selected ionic byproducts and/or selected ionic species that produce the specific ionic byproducts. As a result, different optical indicators may be utilized to detect the presence of different targeted ionic species.

In one implementation, the optical indicator forming freeze-dried reaction agent 30 may comprise a fluorescent probe or fluorophore that, in response to an excitation light source and while directly interacting with the ionic species or its ionic byproducts, change in fluorescence. One type of fluorophore begins to fluoresce or increases in its level of fluorescence in response to an excitation light source and direct interaction with a target ionic species and/or the ionic byproduct of the target ionic species. In such implementations, the sample may additionally include various ions associated with the fluorophore. Examples of fluorophores include, but are not limited to, Calcein, Fluorescein, EvaGreen®, SYBR® Green, SYTO™-X, or any other fluorescent indicator useful in either real time or endpoint optical detection of nucleic acid amplification.

Another type of fluorophore stops fluorescing or decreases its level of fluorescence in response to an excitation light source while directly interacting with the targeted ionic species and/or the ionic byproduct of the targeted ionic species. In such implementations, the sample that wets the freeze-dried reaction agent 30 may additionally include various ions associated with the fluorophore. Examples of such fluorophores include, but are not limited to, Methylene Blue. In such implementations, the fluorophore optical indicator, in response to being impinged by an excitation light source provided by an interrogating light from a light source, provides a level of fluorescence that may be sensed by an optical sensor to indicate the presence of the targeted ionic species either directly or as inferred from the detected presence of the ionic byproducts of the targeted ionic species.

In another implementation, the optical indicator forming freeze-dried reaction agent 30 may comprise a dye that, in in response to interacting directly with the targeted ionic species or the ionic byproducts of the targeted ionic species, changes in color, changes its properties with respect to absorbing an interrogation light from an excitation light source. In such an implementation, an interrogation light is directed at the sample that is wetted the dye within volume 34, wherein the dye differently absorbs selected wavelengths of light in response to directly interacting with the targeted ionic species or its ionic byproducts. The wavelengths of light not absorbed by the dye (the color of the sample) are sensed to indicate the presence of the targeted ionic species either directly or as inferred from the detected presence of the ionic byproducts of the targeted ionic species. Examples of such optic indicators in the form of a dye include, but are not limited to, Hydroxynaphthol Blue.

Figure 2:
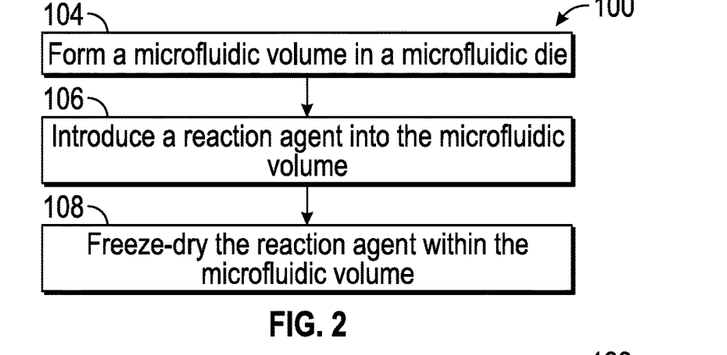
FIG. 2 is a flow diagram of an example method for forming an example microfluidic reaction system.

FIG. 2 is a flow diagram of an example method 100 for forming a microfluidic reaction system, such a system 20 described above. Although method 100 is described in the context of forming system 20 described above, it should be appreciated that method 100 may likewise be utilized to form any of the microfluidic reaction system describing this disclosure are similar microfluidic reaction systems.

As indicated by block 104, microfluidic volume 34 is formed in my fluidic die 22. As discussed above, the microfluidic volume 34 may comprise a reservoir, a passage, a slot or any other volume or sub volume that contains or guides fluid. Microfluidic volume 34 may comprise multiple sub volumes connected in some fashion to one another. Microfluidic volume 34 may be formed in a variety of different fashions, directly into a substrate or within at least one layer of material residing upon a substrate.

As indicated by block 106, a reaction agent, in fluid form, is introduced into the microfluidic volume 34. In particular, the reaction agent, in fluid form, is deposited through port 24 into microfluidic volume 34. In some implementations, the reaction agent, a fluid form, may be distributed throughout different portions of the microfluidic volume through the use of capillary forces. In some implementations, pumps or fluid ejectors may be utilized to draw our move the fluid reaction agent into selected portions of the microfluidic volume. For example, in one implementation, the microfluidic volume 34 may contain a fluid void of the reaction agent and may be connected to a source of the reaction agent a fluid form. Fluid ejectors may eject existing fluid from selected portions of the microfluidic volume 34, wherein the ejected fluid is replaced with the fluid containing the reaction agent is drawn into the selected portions of the microfluidic volume 34. In another implementation, the existing fluid void of the reaction agent may be displaced by a pump, such as an inertial pump, drawing supplied fluid containing the reaction agent into selected portions of the microfluidic volume 34. In still other implementations, an external pump may move fluid containing the reaction agent through port 24 into or along selected portions of microfluidic volume 34. In still other implementations, microfluidic valves, provided on microfluidic die 22, may be used to control the flow of fluid containing the reaction agent to selected portions of microfluidic volume 34.

As indicated by block 108, the fluid carrying the reaction agent is freeze-dried to form the layer freeze-dried reaction agent in the selected portions of microfluidic volume 34, coating selected surfaces of microfluidic volume 34. In one implementation, the reaction agent containing fluid is freeze-dried by rapidly freezing the fluid and then creating a vacuum which removes ice by sublimation. The temperature values and duration for the freezing as well as the pressure values and duration for the vacuum may vary depending upon the characteristics of the fluid and its reaction agent as well as the particular characteristics of microfluidic volume 34.

Figure 3:
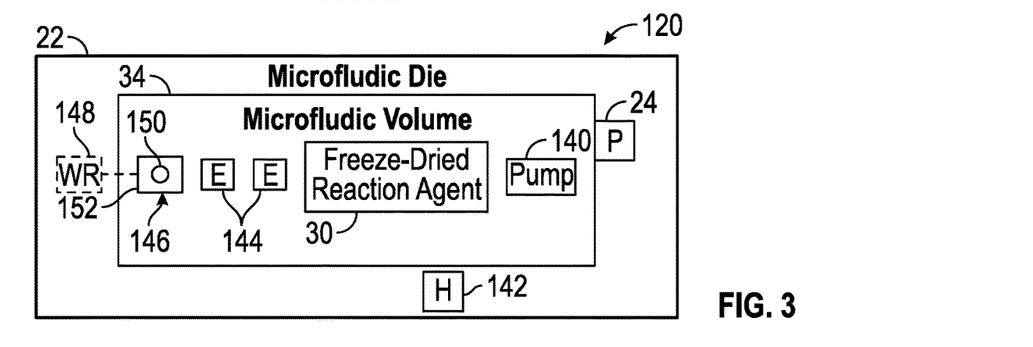
FIG. 3 is a schematic diagram of portions of an example microfluidic reaction system.

For example, in one implementation in which reaction agent 30 comprises a lypholized protein reagent or tissue factor, the solution containing the reaction agent 30, within a microfluidic channel having dimensions on the order of 10 microns, may be freeze-dried with the following procedure parameters:

Pre-freeze for 30-45 min
 −50° C.
 670 Torr
Freeze 0-5 min
 −50° C.
 470 Torr
Keep condenser at −50°
Bring pressure down to 200 mTorr
$1^{st}$ dry for 840 min
 10° C.
 100 mTorr
$2^{nd}$ dry for 240 min
 20° C.
 100 mTorr FIG. 3 schematically illustrates portions of an example microfluidic reaction system 120. Like microfluidic reaction system 20, microfluidic reaction system 120 is pre-provided with a reaction agent for testing, wherein the reaction agent is freeze-dried in the microfluidic volume. Microfluidic reaction system 120 is similar to microfluidic reaction system 20 except that microfluidic reaction system 120 additionally comprises pump 140, heater 142, electrodes 144 and fluid ejector 146. Those remaining components of microfluidic reactor system 120 which correspond to components of microfluidic records system 20 are numbered similarly.

Pump 140 comprise a device supported by microfluidic die 22 that displaces fluid within microfluidic volume 34. In one implementation, pump 140 comprises an inertial pump. In one such implementation, the inertial pump providing pump 140 comprises a fluid actuator that displaces fluid within a microfluidic passage. The fluid actuator may include a piezoelectric membrane based actuator, a thermal resistor based actuator, an electrostatic membrane actuator, a mechanical/impact driven membrane actuator, a magnetostrictive drive actuator, or other such elements that may cause displacement of fluid responsive to electrical actuation. For example, in one implementation, pump 140 may comprise a thermal resistor which generates sufficient heat during the conduction of electrical current to vaporize adjacent fluid, creating a bubble that displaces adjacent fluid.

In one implementation, pump 140 may displace fluid received through port 24 towards the portions of my fluidic volume 34 having surfaces containing the freeze-dried reaction agent 30. In one implementation, pump 140 may displace fluid that comprises the sample introduce report 24 and the reaction agent after the reaction agent has been wetted by the sample. For example, pump 140 may displace the solution containing the sample and the reaction agent towards electrodes 144 and/or towards fluid ejector 146. As described above, in some implementations, pump 140 may be utilized to selectively drive a fluid solution containing the reaction agent to selected portions of microfluidic volume 34 for subsequent freeze-drying. In some implementations, pump 140 may be part of a microfluidic valve for functions such as directing a solution containing the reaction agent to selected portions of microfluidic 534 for subsequent freeze-drying and/or for directing a sample introduce through port 24 to selected portions of microfluidic volume 34. In some implementations, pump 140 may comprise multiple pumping elements distributed throughout microfluidic volume 34. In some implementations, pump 140 may be omitted.

Heater 142 comprises a device supported on microfluidic die 22 to heat fluid within microfluidic volume 34. Heater 142 may comprise a device to heat fluid within microfluidic volume 34 or thin selected portions of microfluidic volume 34 to multiple different temperatures. For example, heater 142 may heat fluid within microfluidic volume 34 through multiple temperature cycles when carrying out a polymerase chain reaction (PCR) for multiplying or amplifying a component in the sample introduce report 24, such as the sample including a targeted nucleic acid such as a particular strand of deoxyribonucleic acid (DNA) are ribonucleic acid (RNA). In other implementations, heater 142 may heat fluid within microfluidic volume 34 to a preestablished temperature such as when system 120 utilized for a loop mediated isothermal amplification (LAMP) procedure. In one implementation, heater 142 may comprise a thermally conductive resistor that generates heat when conducting electrical current, sometimes referred to as a temperature sense resistor (TSR). In one implementation, heater 142 may comprise multiple heating elements distributed along or within microfluidic volume 34. In some implementations, heater 142 may be omitted.

Electrodes 144 are situated along or proximate to microfluidic volume 34. Electrodes 144 are spaced so as to cooperate with one another to form an electrical connection between such electrodes 144 through the fluid within microfluidic volume 34. In one implementation, electrodes 144 form an impedance sensor which detects the presence of particles or cells or counts the number of particular cells flowing past such electrodes 144 based on changes in impedance across electrodes 144. In another implementation, electrodes 144 cooperate to form an electrochemical sensor for electrochemical detection of characteristics or properties of the sample introduce through port 24 for testing. In one implementation electrodes 144 interact with fluid before the fluid has wetted freeze-dried reaction agent 30. In another implementation, electrodes 144 interact with fluid comprising both the introduced sample and the absorbed reaction agent, after the sample has wetted freeze-dried reaction agent 30. In some implementations electrodes 144 may comprise multiple sets of electrodes distributed at multiple spaced locations within microfluidic volume 34. In some implementations, electrodes 144 may be omitted.

Fluid ejector 146 comprise a device supported by my fluidic die 22 that is to selectively eject fluid from within microfluidic volume 34. As shown by broken lines, in one implementation, the fluid ejected by fluid ejector 146 may be discharged to a waste reservoir 148 provided in my fluidic die 22. In one implementation, the fluid ejected a fluid ejector 146 may be discharged off of microfluidic die 22. In one implementation, the ejection of the fluid by fluid ejector 146 facilitate movement of fluid within microfluidic volume 34.

In one example implementation, fluid ejector 146 comprises an orifice 150 and a fluid actuator 152. Orifice 150 extends from a portion of the microfluidic fluid volume 34, such as a firing chamber forming a part of microfluidic volume 34. Fluid actuator 152 displaces fluid through orifice 150. A fluid actuator displaces fluid within a microfluidic passage. The fluid actuator 152 may include a piezoelectric membrane based actuator, a thermal resistor based actuator, an electrostatic membrane actuator, a mechanical/impact driven membrane actuator, a magneto-strictive drive actuator, or other such elements that may cause displacement of fluid responsive to electrical actuation. For example, in one implementation, fluid actuator 152 may comprise a thermal resistor which generates sufficient heat during the conduction of electrical current to vaporize adjacent fluid, creating a bubble that displaces adjacent fluid through orifice 150. In some implementations, fluid ejector 146 may comprise multiple separate fluid ejectors located at various locations throughout microfluidic volume 34. In some implementations, fluid ejector 146 may be omitted.

Figure 4:
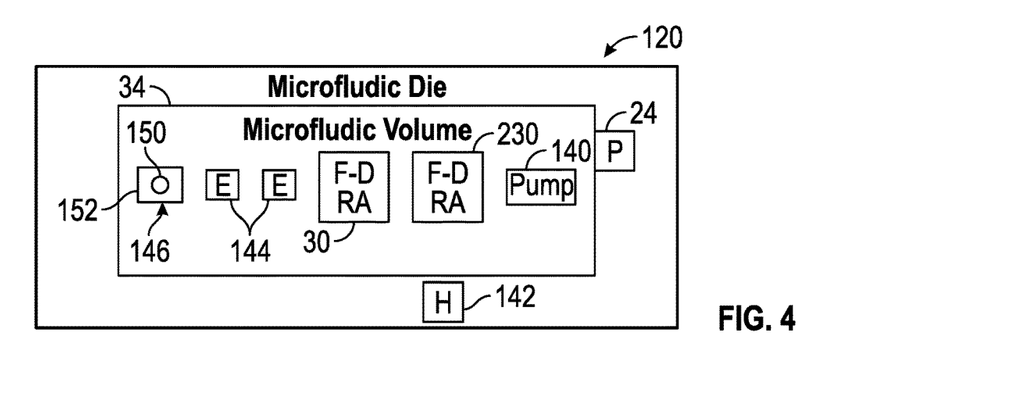
FIG. 4 is a schematic diagram of portions of an example microfluidic reaction system.

FIG. 4 schematically illustrates portions of an example microfluidic reaction system 220. Microfluidic reaction system 220 is similar to microfluidic reaction system 120 except that microfluidic reaction system 220 additionally comprises freeze-dried reaction agent 230. Those remaining components of microfluidic reaction system 220 which correspond to components of microfluidic reaction system 120 are numbered similarly.

Freeze-dried reaction agent 230 comprises a freeze-dried reaction agent that is different in composition and/or different in density as compared to freeze-dried reaction agent 30. Freeze-dried reaction agents 30 and 230 are located or formed in different portions of microfluidic volume 34. Freeze-dried reaction agents 30 and 230 may provide different types of reactions with the same chemical or biological element of the sample introduced through port 24, may each differently react with a different chemical or biological element of the sample introduced through port 24 and/or may react with particular chemical art biological elements of the sample introduce report 40 to different extents. In one implementation, reaction agents 30 and 230 may produce or invoke different responses or different types of responses based upon interaction with a targeted chemical or biological element and a particular type of interrogation, optical or electrical.

In one implementation, freeze-dried reaction agent 230 may be located "upstream" of freeze-dried reaction agent 30 so as to preliminarily react with a sample introduced through port 24 prior to sample 40 interacting with freeze-dried reaction agent 30. In some implementations, the response from such preliminary reaction may be sensed prior to the solution further moving into contact with freeze-dried reaction agent 30. In another implementation, freeze-dried reaction agent 230 may be located along a different path or branch of microfluidic volume 34 as compared to freeze-dried reaction agent 30. In such an implementation, pump 140 or a valve may selectively direct the sample introduced through port 24 to a selected one of freeze-dried reaction agents 30 and 230.

In other implementations, freeze-dried reaction agent 230 may be similar to freeze-dried reaction agent 30, wherein freeze-dried reaction agents 30 and 230 are located in different portions of microfluidic volume 34. For example, freeze-dried reaction agents 30 and 230 may be located in different branches, wherein the sample introduced through port 24, after wetting freeze-dried reaction agent 30 is sensed, optically or electrochemically with an optical detector or with electrodes 144. Based on the results of such first sensing, the solution is either directed to freeze-dried reaction agent 230 for additional reaction with additional reaction agent or is not directed to the location at which reaction agent 230 is located, such as being diverted around reaction agent 230. In such an implementation, system 220 may provide closed-loop feedback control over the extent to which the sample introduced through port 24 is exposed to a reaction agent, providing extra exposure to a first amount of reaction agent 230 or a second greater amount of reaction agent, reaction agents 230+30. In some implementations, the spacing between reaction agents 230 and 30 may offer a phased or step wise reaction respect to the sample by the same reaction agent provided in two separate batches, 230 and 30.

Figure 5:
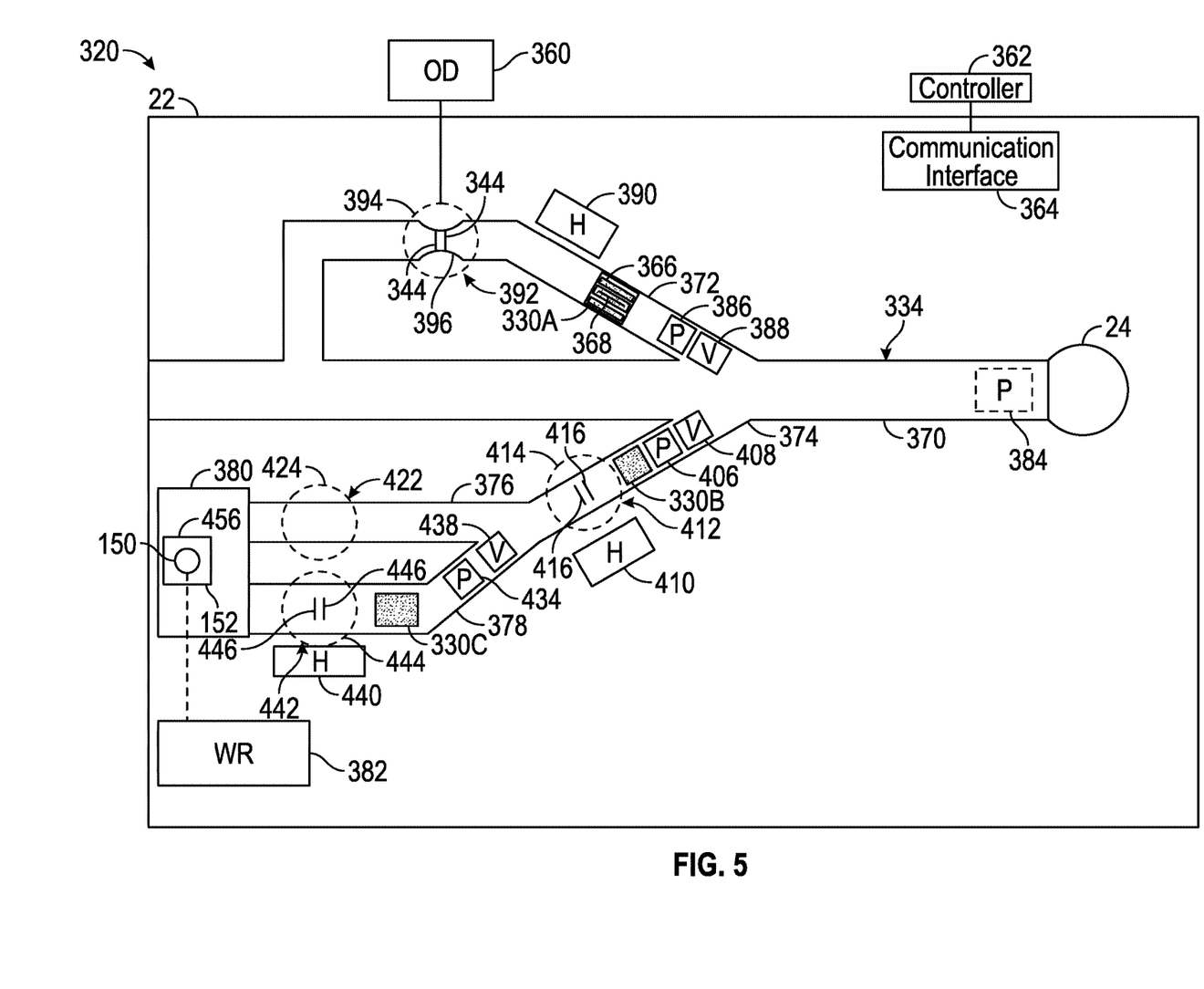
FIG. 5 is a schematic diagram of portions of an example microfluidic reaction system.

FIG. 5 schematically illustrates an example microfluidic reaction system 320. System 320 is similar to system 220 described above except that system 320 comprises an example microfluidic volume 334 along with example components at specific locations in microfluidic volume 334 and example locations for freeze-dried reaction agents. System 320 is additionally illustrated as comprising components external to microfluidic die 22, optical detector 360 and controller 362. The microfluidic die 22 is illustrated as comprising a communications interface 364 to facilitate communication between controller 362 and components on microfluidic die 22. Those components of system 320 which correspond to components of system 220 are numbered similarly.

Microfluidic volume 334 comprises an elongate slot 370, microfluidic passage 372, microfluidic passage 374, microfluidic passage 376, microfluidic passage 378, fluid reservoir 380 and waste reservoir 382. Slot 370 comprises a microfluidic channel extending from port 24 for directing a received sample along microfluidic die 22. As shown by broken lines, in one implementation, slot 370 may comprise a pump 384, such as an inertial pump formed by fluid actuator to assist in movement of the received sample along slot 370. In other implementations, pump 384 may be omitted.

Microfluidic passage 372 branches off of slot 370 and loops back to slot 370. Microfluidic passage 372 contains a fluid pump 386, such as an inertial pump provided by a fluid actuator, such as a thermal resistor. Pump 386 may displace fluid along passage 372, potentially drawing fluid from slot 370. In one implementation, the flow of fluid from slot 370 into passage 372 may be further controlled by a microfluidic valve 388 between passage 372 and slot 370. In some implementations, one or both of pump 386 and/or valve 388 may be omitted.

As further shown by FIG. 5, microfluidic passage 372 has a portion containing freeze-dried reaction agent 330A. Freeze-dried reaction agent 330A may be similar to freeze-dried reaction agent 30 described above. In the example illustrated, freeze-dried reaction agent 330 coats a proud portion 366 rising up from a floor of passage 372. In one implementation, the proud portion 366 supports a heater 368 in the form of a thermal resistor. In some implementations, passage 372 may extend adjacent to a heater 392 heat fluid within passage 372. Heater 390 may be in the form of a thermal resistor which emits heat upon conducting electrical current.

Microfluidic passage 372 further contains a sensing region 392 where the sample introduced through port 24 and directed along passage 372, after interacting with freeze-dried reaction agent 330A, is sensed. In one implementation, sensing region 392 comprises an optical window 394 by which optical detector 360 may sense of fluid within sensing region 392. In one implementation, sensing region 392 may additionally or alternatively comprise electrodes 344, similar to electrodes 144 described above. In some implementations, sensing region 392 may include a constriction 396. Such a constriction 396 may facilitate the counting of cells are particles by electrodes 344 or may facilitate the sensing of a degree of coagulation through constriction 396 by electrodes 344 or optical detector 360.

Microfluidic passage 374 branches off of slot 370. As with microfluidic passage 372, microfluidic passage 374 contains a fluid pump 406, such as an inertial pump provided by a fluid actuator, such as a thermal resistor. Pump 406 may displace fluid along passage 374, potentially drawing fluid from slot 370. In one implementation, the flow of fluid from slot 370 into passage 374 may be further controlled by a microfluidic valve 408 between passage 374 and slot 370. In some implementations, one or both of pump 406 and/or valve 408 may be omitted.

Microfluidic passage 374 has a portion containing a freeze-dried reaction agent 330B. Freeze-dried reaction agent 330B may be similar to freeze-dried reaction agent 30 described above. In one implementation, freeze-dried reaction agent 330B is different than freeze-dried reaction agent 330A. In one implementation, freeze-dried reaction agent 330B as a different chemical composition as compared to agent 330A so as to produce or invoke a different response to provide a different reaction as compared to agent 330A. In one implementation, freeze-dried reaction agent 330B has the same chemical composition as agent 330A, but a different concentration, density or extent of coverage (covering a larger surface area). In some implementations, passage 374 may extend adjacent to a heater 410 heat fluid within passage 374. Heater 410 may be in the form of a thermal resistor which emits heat upon conducting electrical current.

Microfluidic passage 374 further comprises a sensing region 412. Sensing region 412 is similar sensing region 392. In the example illustrated, sensing region 412 facilitates the sensing of fluid after the sample that of been introduced through port 24 and drawn into fluid passage 374 has interacted with reaction agent 330B. Sensing region for one to facilitate such sensing in either or both of an electrochemical fashion and an optical fashion. To this end, sensing region 412 comprises an optical window 414 facilitating sensing by optical detector 360 as well as electrodes 416. Window 414 and electrodes 416 are similar to windows 394 and electrodes 344 described above.

Microfluidic passage 376 branches off of microfluidic passage 374. Microfluidic passage 376 comprises a sensing region 422 in the form of an optical window 424 to facilitate optical sensing by optical detector 360. Some implementations, sensing region 422 may be omitted.

Microfluidic passage 378 branches off of microfluidic passage 374. The flow of fluid through my fluid passage 378 may be controlled through the use of microfluidic pump 434 and/or microfluidic valve 438. Microfluidic pump 434 may comprise an inertial pump formed by a fluid actuator, such as a thermal resistor. Microfluidic pump 434 and such are microfluidic valve 438 further control the flow of fluid through my fluidic passage 376. In some implementations, pump 434 and/or valve 438 may be omitted.

Microfluidic passage 378 further comprises freeze-dried reaction agent 330C. Freeze-dried reaction agent 330C may be similar to freeze-dried reaction agent 30 described above. In one implementation, freeze-dried reaction agent 330C is different than freeze-dried reaction agent 330A and freeze-dried reaction agent 330B. In one implementation, freeze-dried reaction agent 330C has a different chemical composition as compared to agent 330A and 330B so as to produce or invoke a different response to provide a different reaction as compared to agents 330A, 330B. In one implementation, freeze-dried reaction agent 330C has the same chemical composition as agent 330B, but a different concentration, density or extent of coverage (covering a larger surface area). In one implementation, freeze-dried reaction agent 330C as a same composition as freeze-dried reaction agent 330A, different than that of freeze-dried reaction agent 330B. In some implementations, passage 378 may extend adjacent to a heater 440 to heat fluid within passage 378. Heater 440 may be in the form of a thermal resistor which emits heat upon conducting electrical current.

Microfluidic passage 378 further comprises a sensing region 442. Similar to sensing region 412, sensing region 442 may comprise an optical window 444 and electrodes 446. Optical window 444 and electrodes 446 may be similar to optical window 394 and lector 344 described above.

Fluid reservoir 380 receives fluid from passages 376 and 378. In the example illustrated, fluid reservoir 380 contains a fluid ejector 456, similar to fluid ejector 146 described above. Fluid ejector 456 may eject fluid into waste reservoir 382 provided by fluidic die 22.

Optical detector 360 comprises an optical sensor that interrogates fluid within sensing regions 392, 412, 422 and 442 through optical windows 414, 394, 424 and 444, respectively. In one implementation, optical detector 360 directs light through such windows onto the fluid, wherein response of the fluid to the interrogating light is sensed. In another implementation, optical detector 360 senses the fluorescence or omissions from the fluid within such sensing regions. In some implementations, optical detector 360 may be omitted.

Controller 362 comprises a processor comprising hardware architecture to retrieve executable code from a data storage device or computer-readable medium and execute instructions in the form of the executable code. The processor may include a number of processor cores, an application specific integrated circuit (ASIC), field programmable gate array (FPGA) or other hardware structure to perform the functions disclosed herein. The executable code may, when executed by the processor, cause the processor to implement the functionality of pumps 384, 386, 406 and 434, valves 388, 408, 438, heaters 390, 410, 440, fluid ejector 456, electrodes 344, 416, 446 and/or optical detector 360. In the course of executing code, the processor may receive input from and provide output to a number of the remaining hardware components, directly or indirectly. Controller 362 communicates with such components on microfluidic die 22 via communication interface 364 which may comprise electrical contact pads, electrical sockets, electrical pins or other interface structures. In one implementation, communication interface 364 may facilitate wireless communication.

Controller 362 may facilitate the locating of freeze-dried reaction agents 330A, 330B and 330C within microfluidic volume 334. For example, in one implementation, controller 362 may control the described valves and pumps when a solution containing a reaction agent is introduced through port 24 to direct flow of the solution prior to freeze-drying of the solution. In the example illustrated, controller 362 may direct a solution containing freeze-dried reaction agent 330C to the illustrate location within passage 378 through the selective control of valves 408, 438 and/or pumps 406, 434. Once the solution has reached the desired location within passage 378, the solution may be freeze-dried.

Likewise, the solution containing reaction agent 330B may be directed through the control of pump 384, valve 408 and/or pump 406 by controller 362 to locate the solution within passage 374. Once located within passage 374, the solution may be freeze-dried. The solution containing reaction agent 330A may be directed through the control of pump 384, valve 388 and/or pump 386 by controller 362 to locate the solution within passage 372. Once located within passage 372, the solution may be freeze-dried.

Controller 362 may further control the testing of a sample introduced through port 24. For example, controller 362 may control, through the output of control signals, the direction in which the sample moves through microfluidic volume 334 as well as the timing of such movement. Controller 362 may control pumps 384, 386, 406 and 434 and/or valves 388, 408, 438 to direct the sample through various stages within microfluidic volume 334. Controller 362 may further control the operation at which heaters 390 and 410 are powered to control the temperature and duration of heating within each of such passages. As a result, the sample may undergo various selected reactions, various selected heating cycles and various sensing operations under the control of controller 362.

Figure 6:
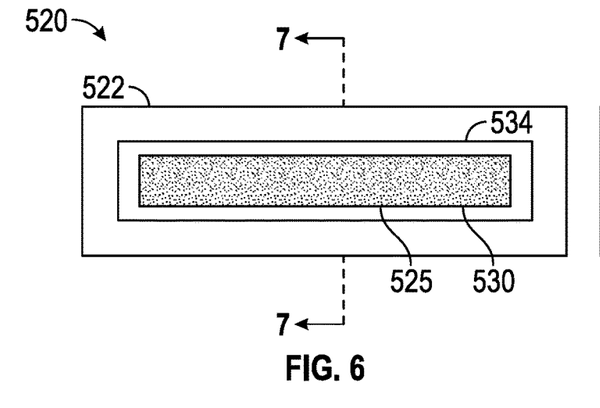
FIG. 6 is a top view of an example microfluidic reaction system.
Figure 7:
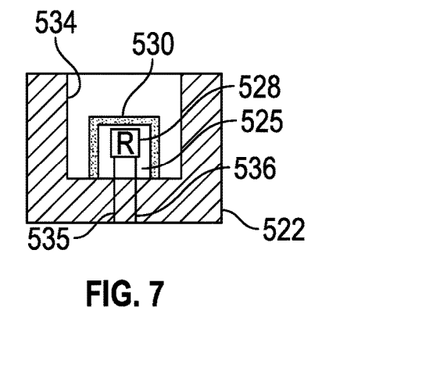
FIG. 7 is a sectional view of the example microfluidic reaction system of FIG. 6 taken along line 7-7.

FIGS. 6 and 7 schematically illustrate portions of an example microfluidic reaction system 520. Microfluidic reaction system 520 comprises microfluidic die 522, proud structure 525, resistor 528 and freeze-dried reaction agent 530. Microfluidic die 522 is similar to microfluidic die 22 described above. Microfluidic die 522 comprises a microfluidic volume 534. Microfluidic volume 534 may be similar to microfluidic volume 34 containing freeze-dried reaction agent 30 as described above. In the example illustrated, microfluidic volume 534 comprises an elongate slot having an upper opening which also serves as a port for the introduction of a sample being tested.

Proud structure 525 comprises a structure rising within microfluidic volume 534. Proud structure 525 is surrounded on at least three sides by the volume of microfluidic volume 534. Resistor 528 comprises a thermal resistor supported on the surface or embedded within proud structure 525. Resistor 528 produces heat in response to the conduction of electrical current. Resistor 528 is part of an electrical circuit, wherein resistor 528 is supplied with electrical current through elected conductive lines 535, 536, one of such line is connected to a power source and the other such line connected to a ground. Such electrical current may be selectively supplied to resistor 528 using one or more electric switches under control of a controller such as controller 362 described above.

Freeze-dried reaction agent 530 is similar to freeze-dried reaction agent 30 described above. Freeze-dried reaction agent 534 may be layered over the top and sides of proud structure 525. Because proud structure 525 project into the fluidic volume 534, proud structure 525 provides a larger surface area upon which freeze-dried reaction agent 530 may coat, potentially enhancing reaction with an introduced sample. In addition, the additional surface area provided by proud structure 525 offers a greater area by which heat from resistor 528 may be thermally conducted to the surrounding sample. Although freeze-dried reaction agent 530 is illustrated as covering the top and sides of proud structure 525, in other implementations, freeze-dried reaction agent 530 may additionally cover the floor and internal sides of microfluidic volume 534.

System 520 provides a ready to use testing unit, wherein a sample may be deposited in a microfluidic volume 534 through the upper opening of the slot forming microfluidic volume 534. The introduce sample may then wet the freeze-dried reaction agent 530, forming a solution containing the sample and the reaction agent. In those applications utilizing heat, the reacted sample may then be heated using resistor 528. The sample may be heated through a single heating cycle or through multiple heating cycles depending upon the testing procedure, such as LAMP or PCR. During such heating cycles or following such heating cycles, electrochemical sensor or an optical sensor may sense the reacted sample or its response to an interrogating light.

Figure 8:
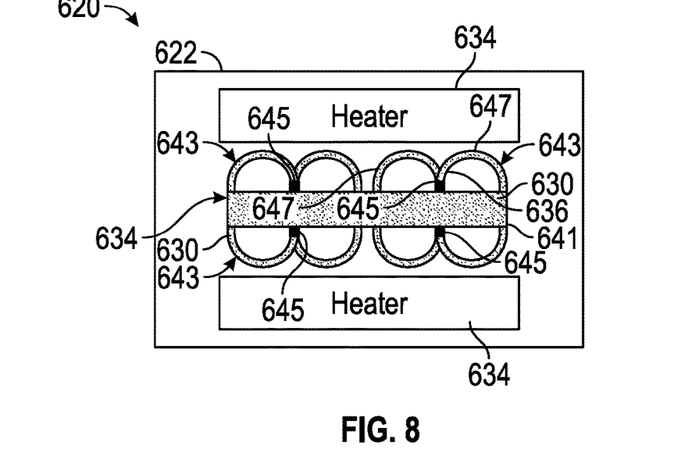
FIG. 8 is a top view schematically illustrating portions of an example microfluidic reaction system.

FIG. 8 schematically illustrates portions of an example microfluidic reaction system 620. Microfluidic reaction system 620 comprises microfluidic die 622, freeze-dried reaction agent 630, heaters 634 and fluid pumps 636. Microfluidic die 622 is similar to microfluidic die 22 described above. Microfluidic die 622 includes a microfluidic volume 634 in which freeze-dried reaction agent 630 is coated.

Microfluidic volume 634 comprises microfluidic slot 641 and microfluidic circulation passages 643. Slot 641 extends along microfluidic die 622 and delivers and introduce sample to each of circulation passages 643. The example illustrated, slot 641 has an upper opening serving as a port by which a sample may be introduced.

Circulation passages 643 draw fluid from slot 641 and return such fluid back to slot 641. In the example illustrated, each of passages 643 is m-shaped, having a shared inlet 645 and a pair of portions 647 that branch from the shared inlet 645 and extend back to slot 641. Portions 647 distribute the flow of fluid along die 622 and along heaters 634 to mix and more uniformly heat such fluid.

Freeze-dried reaction agent 630 is similar to freeze-dried reaction agent 30 described above. Freeze-dried reaction agent 630 coats at least portions of the internal surfaces of microfluidic volume 634. In the example illustrated, freeze-dried reaction agent 630 coats the internal surfaces of both slot 630 and passages 643. In other implementations, freeze-dried reaction agent zero may coat slot 641 without coating passages 643 or vice versa.

Heaters 634 are located along portions 647 of passages 643. In another implementation, heaters 634 may be replaced with that underlies patches 643 and/or slot 630. In one implementation, heaters 634 each comprise a thermal resistor which emits heat upon conducting electric current as supplied by power source under the control of the controller, such as controller 362 (shown in FIG. 5).

Pumps 636 displace fluid and move fluid along each of passages 643. Pumps 636 are located within the shared inlet 645 of each of passages 643. In one implementation, each of pumps 636 comprises an inertial pump driven by an associated fluid actuator. In one implementation, the fluid actuator may comprise a thermal resistor which generate sufficient heat during the conduction electrical current to vaporize adjacent fluid, creating a bubble so as to drive or displace surrounding fluid. In other implementations, other types of fluid actuators may be utilized or other types of pumps may be utilized.

Figure 9:
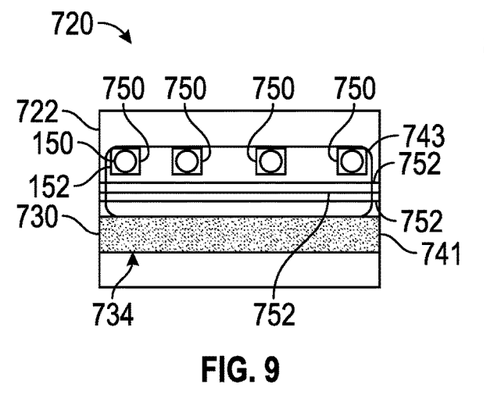
FIG. 9 is a top view schematically illustrating portions of an example microfluidic reaction system.

FIG. 9 schematically illustrates portions of an example microfluidic reaction system 720. Microfluidic reaction system 720 comprises microfluidic die 722, freeze-dried reaction agent 730, fluid ejectors 750 and sensing electrodes 752. Microfluidic die 722 is similar microfluidic die 22 described above. Microfluidic die 722 comprises a microfluidic volume 734.

Microfluidic volume 734 comprises slot 741 and sensing chamber 743. Slot 741 extends along microfluidic die 722 and delivers an introduced sample to sensing chamber 743 and other sensing chamber situated along slot 741. In the example illustrated, slot 741 has an upper opening serving as a port by which a sample may be introduced. Reaction chamber 743 comprises a volume along slot 741 containing fluid ejectors 750 and sensing electrodes 752.

Freeze-dried reaction agent 730 is similar to freeze-dried reaction agent 30 described above. Freeze-dried reaction agent 730 coats internal surfaces of slot 741. Freeze-dried reaction agent 730 is absorbed by and introduce sample in slot 741.

Fluid ejectors 750 are each similar to fluid ejector 152 described above. Each of fluid ejectors 750 comprises an orifice 150 through which fluid is ejected by fluid actuator 152. In one implementation, orifice 150 may open to a waste reservoir located on microfluidic die 722. In yet another implementation, orifice 150 may open to other fluid receiving passages or volumes. Fluid actuator 152 may comprise a thermal resistor which generate sufficient heat upon conducting electric current so as to vaporize adjacent fluid, creating a bubble that expels non-vaporize fluid through orifice 150. In other implementations, fluid actuator 152 may comprise other types of fluid actuators. Fluid actuators 152 eject fluid from sensing chamber 643, drawing new fluid to be sensed from slot 741.

Sensing electrodes 752 comprise electrodes formed in or along sensing chamber 743. In one implementation, sensing electrodes 752 form an impedance sensor for the purpose of sensing the presence of cells or particles or counting such cells or particles. In another implementation, sensing electrodes 752 comprise electrochemical detectors for indicating the composition of a reactive sample by sensing an electrochemical response of the sample to its reaction with freeze dried reaction agent 730. In other implementations, the reacted fluid within sensing chamber 743 may be additionally sensed by an optical detector, wherein the reacted sample may be interrogated with interrogating light transmitted through an optical window or opening. In some implementations, sensing electrodes 752 may be omitted.

Figure 10:
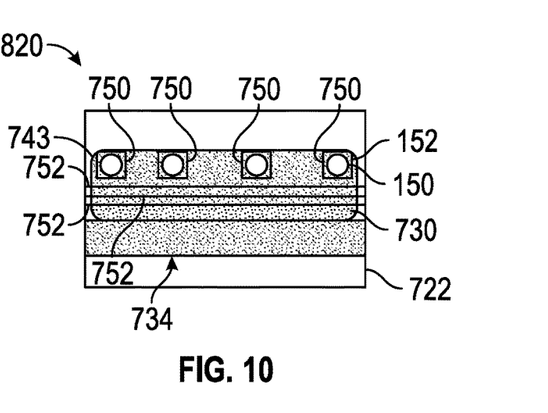
FIG. 10 is a top view schematically illustrating portions of an example microfluidic reaction system.

FIG. 10 schematically illustrates portions of an example microfluidic reaction system 820. System 820 is similar to system 720 described above except that freeze-dried reaction agent 730 additionally coats sensing chamber 743. Those remaining components of system 820 which correspond to components of system 720 are numbered similarly.

Figure 11:
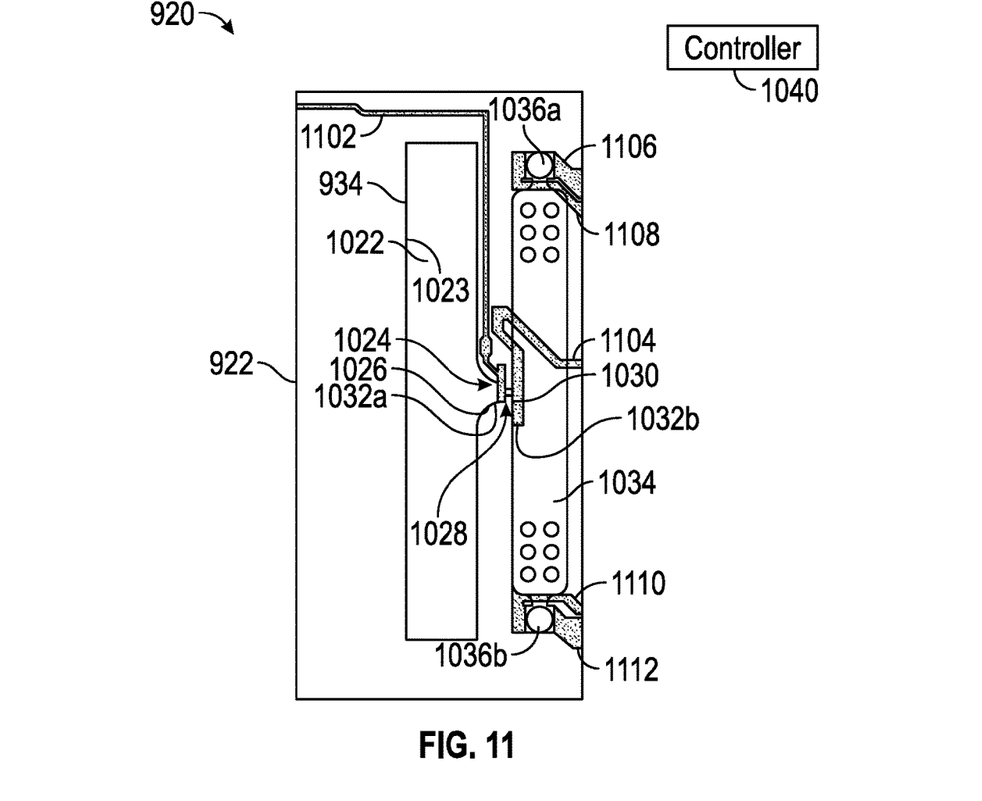
FIG. 11 is a top view illustrating portions of an example microfluidic reaction system
Figure 12:
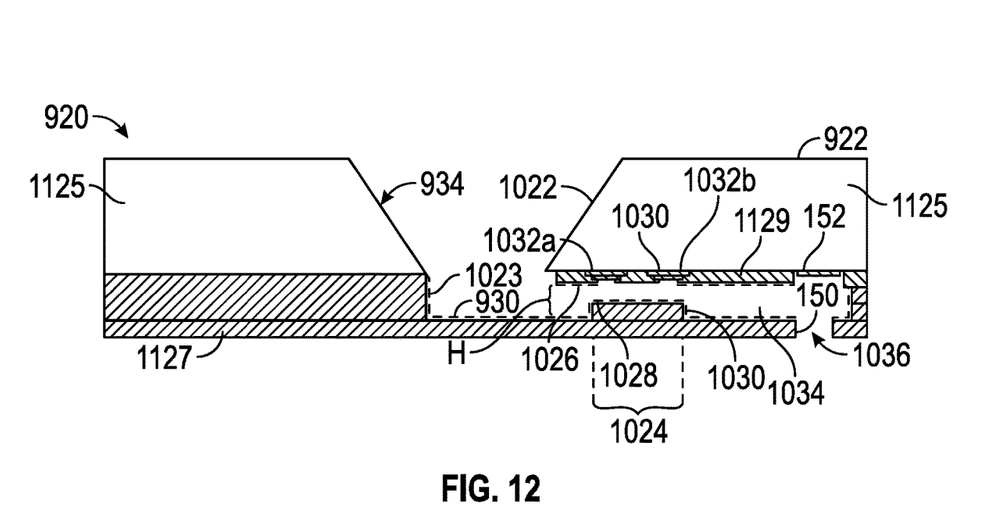
FIG. 12 is a sectional view illustrating portions of the example microfluidic reaction system of FIG. 11.

FIGS. 11 and 12 illustrate portions of example microfluidic reaction system 920. Microfluidic reaction system 920 may be provided for the testing of clotting characteristics of a blood sample. Microfluidic reaction system 920 utilizes a freeze-dried reaction agent in the form of an activator comprising freeze-dried tissue factor or a lyophilized protein reagent which coats portions of an internal microfluidic volume of microfluidic die 922. The microfluidic volume is sized and shaped to enhance such testing.

A sample of fluid (e.g., blood) can enter via slot 1022, flowing, for example, in a direction perpendicular to the plane of the drawing. Sample is induced to enter and flow through pinch point 1024 in the direction indicated by the arrow associated with reference numeral 1024 by either or a combination of positive pressure (slot-side) or negative pressure (via pull from chamber 1034, e.g., via the draw provided by air-liquid interfaces of fluid ejectors 1036a, 1036b). Pinch point 1024 includes a squeezed channel 1028 where sensor 1032 for measuring red blood cell flow can be roughly located. The size of channel 1028 helps determine the sensitivity to cell flow and affects the likelihood of clogging.

Following passage through pinch point 1024, sample can collect in chamber 1034, and in some instances, liquid portion of sample (e.g., blood plasma) can be drawn out through fluid ejectors 1036a, 1036b. Chamber 1034 can be sized to allow cells to fill without backing up into pinch point 1024. For example, the chamber can be large enough to allow continuous filling of red blood cells from undiluted whole blood sample for at least two minutes. Chamber 1034 may be sized, for example, to collect thousands of red blood cells during a test. Thus, chamber 1034 promotes red blood cell packing for the duration of the coagulation test. Unhindered packing of the chamber until sufficient measurement data to compute prothrombin time has been collected from sensor 1032 can facilitate the gathering of useful measurement data set from sensor 1032.

Fluid ejectors 1036a, 1036b can include holes in the microfluidic chamber 1034, the size and location of which act as a driving force for wetting and the speed of cell flow. Fluid ejectors can be, for example, of the type used as thermal ink-jet pumps in ink-jet printers. In many instances, sample may contain discrete features in a carrier fluid (e.g., red blood cells in blood plasma). The evaporation of carrier fluid (e.g., plasma) at an air-liquid interface (e.g., meniscus) can drive the movement of the discrete features (e.g., cells) toward the air liquid interface where evaporation is occurring, i.e., toward the fluid ejectors 1036. In such cases, the fluid ejectors provide passive promotion of flow. In some examples, however, fluid ejectors can provide active flow by providing each nozzle with one or more pumps to eject fluid. For example, fluid ejectors can include firing resistor to eject fluid out of fluid ejectors, which can hasten the testing process.

In addition to promoting migration of discrete sample features through pinch point 1024 during a test, fluid ejectors 1036 can also promote evaporation and clumping of activator (e.g., tissue factor) during the voidage coating and freeze-drying process that can be part of the fabrication process of system 920. Fluid ejectors 1036a, 1036b can be located on either side of the chamber 1034 to promote discrete feature (e.g., red blood cell) flow and packing. Each fluid ejector 1036a, 1036b can be less than sixty micrometers in diameter and can be located away from the sense zone so that red blood cell packing velocity is not high enough to promote lysing, and red blood cell drying signal does not reach the sensor 1032 in the pinch point 1024. In some examples, no fluid ejector 1036 is located within one hundred micrometers of the pinch point outlet 1030. In some examples, no fluid ejector 1036 is located within thirty micrometers of the pinch point outlet 1030.

The freeze-dried reaction agent 930 serves as an activator that can be used to initialize coagulation at a certain point in the coagulation cascade. In some examples of system 920, all or a portion of microfluidic volume 934 may be internally coated, as a part of the fabrication process, with an activator, e.g., a freeze-dried coagulation initializing tissue factor, to trigger a transformative process in the sample under test, e.g., the clotting cascade in blood. As an example, 25% Dade Innovin tissue factor may be introduced into slot 1022 in liquid form and freeze-dried in the device 1020 to preserve protein activity for subsequent reaction with sample, and to initiate fibrin formation upon wetting by sample. Dade Innovin is one example activator, but any coagulation activator suitable to the test may be used. When freeze-dried, the tissue factor can form a fluffy and spindly structure (not shown) inside the voidage that can wet instantly and evenly when exposed to sample.

Architectural features of microfluidic die 922 can address issues that arise from the above-described internal coating of microfluidic volume 934 the freeze-dried reagent 930. The freeze-dried reagent or activator's coating of walls can result in a higher concentration of activator within the pinch point 1024 and around ports and fluid ejectors 1036. Resultantly, sample may experience a faster rate of fibrin formation at locations of higher local concentration of tissue factor, e.g., in the pinch point 1024 and around ports and fluid ejectors 1036. Clogging of the pinch point 1024 can occur when the width W of the pinch point is too small (e.g., less than ten micrometers). The pinch point 1024 is appropriately shaped and sized in examples that are to be coated with tissue factor. Such examples may also be constructed to have a reduced number of ports and fluid ejectors 1036, e.g., no more than two. Moreover, any posts in the architecture should be in slot 1022 only.

The respective surface areas of the features of microfluidic die 922 can be sized to minimize the coating with activator while still providing adequate surface area for tissue factor coating and sufficient volume for sample flow. For example, slot 1022 can be made to be no greater than 1,200,000 square micrometers in surface area, pinch point 1024 can be made to be no greater than 300 square micrometers in surface area, and chamber 1034 can be made to be no greater than 40,000 square micrometers in surface area. For example, slot 1022 can be made to be between 800,000 and 1,200,000 square micrometers in surface area, pinch point 1024 can be made to be between 160 and 240 square micrometers in surface area, and chamber 1034 can be made to be between 34,000 and 38,000 square micrometers in surface area. For example, slot 1022 can be made to be 1,000,000 square micrometers in surface area, pinch point 1024 can be made to be 200 square micrometers in surface area, and chamber 1034 can be made to be 36,000 square micrometers in surface area.

In the architecture illustrated in FIG. 11, a sensor is formed by two electrodes 1032a, 1032b arranged near the inlet 1026 and outlet 1030 of pinch point 1024, i.e., on either side of microchannel 1028. Electrodes 1032a, 1032b are thereby arranged to measure an electric field between inlet 1026 and outlet 1030, which electric field is concentrated within pinch point 1024. In some examples, the electrode 1032a closer to the slot 1022 serves as a ground electrode. Electrical leads 1102, 1104 can respectively connect electrodes 1032a, 1032b to other circuitry (not shown) for, e.g., amplification, filtering, and eventual delivery to controller 1040. Electrical leads 1106, 1108 can provide electrical power to control fluid ejector 1036a and/or to power a pump associated with fluid ejector 1036a, while electrical leads 1110, 1112 can provide similar functionality for fluid ejector 1036b and/or an associated pump. In the example shown in FIG. 11, inlet 1026 is illustrated as having a funnel shape.

FIG. 12 is a cross-sectional diagram of an example architecture of the microfluidic reaction system 920. As shown in FIG. 12, slot 1022 can taper into main reservoir or passage 1023 where sample can flow through pinch point 1024 into chamber 1034. Similar to the arrangement shown in FIG. 11, electrodes 1032a, 1032b can be arranged near inlet 1026 and outlet 1030 of pinch point 1024, i.e., on either side of channel 1028. Layer 1125 can be, for example, bulk silicon, through which slot can be etched. Additional layers 1127 can be, for example, thin-film deposited using polymer, e.g., SU-8 polymer, which can be made transparent so as to make the preparation of pinch point 1024 with activator visually inspectable and its functioning during a test visually monitorable. SU-8 is an epoxy-based negative photoresist that is highly biocompatible. Polydimethylsiloxane (PDMS) is another example polymer that may be used to deposit additional layers 1127. Insulating layers 1129, 1130 can insulate electrodes 1032a, 1032b and their associated traces from other layers of microfluidic die 922. One port or fluid ejector 1036 is illustrated in FIG. 12. Because FIG. 12 shows a cross-section, the particular shape or features of inlet 1026 and outlet 1030, if any, may not be noted in FIG. 12. FIG. 12 does, however, note height H of pinch point channel 1028.

In both FIGS. 11 and 12 it may be noted that pinch point 1024 and chamber 1034 appear on only one side of slot 1022, i.e., only on the left side as illustrated in these drawings. In some examples, another pinch point and chamber can be placed on the opposite side of slot 1022, more or less in mirror image of pinch point 1024 and chamber 1034 as illustrated in FIGS. 11 and 12. However, the arrangement shown, with no mirror-image pinch point and chamber, can improve sample pressure and thus flow of sample through pinch point 1024. Stated another way, the presence of sample flow blocking wall 1023 on the opposite side of slot 1022 from pinch point 1024 can force sample to channel into chamber 1034 on the open side of slot 1022.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A microfluidic reaction system comprising
a microfluidic die comprising a microfluidic volume comprising a microfluidic channel having a dimension on an order of 10 microns;
a proud structure rising from a floor of the microfluidic volume;
a port connected to the microfluidic volume for receiving a fluid; and
a freeze-dried reaction agent, wherein external surfaces of the proud structure that face the microfluidic volume are coated with the freeze-dried reaction agent.

2. The microfluidic reaction system of claim 1, wherein the microfluidic volume comprises:
a slot; and
fluid passage having an inlet connected to a first portion of the slot and an outlet connected to a second portion of the slot and wherein the system further comprises a pump along the passage to move fluid through the fluid passage.

3. The microfluidic reaction system of claim 1, further comprising a heater supported by the microfluidic die located at the freeze-dried reaction agent to heat fluid within a fluid passage of the microfluidic volume at the freeze-dried reaction agent.

4. The microfluidic reaction system of claim 3, wherein:
the heater is disposed on the proud structure; and
the heater is coated by the freeze-dried reaction agent.

5. The microfluidic reaction system of claim 1 further comprising:
a window to the microfluidic volume at a constricted portion of the microfluidic channel; and
an optical sensor supported by the microfluidic die to sense fluid through the window.

6. The microfluidic reaction system of claim 1 further comprising a pair of spaced electrodes along the microfluidic volume, the electrodes positioned upstream of the freeze-dried reaction agent.

7. The microfluidic reaction system of claim 1 wherein:
the microfluidic volume comprises a first sub volume and a second sub volume sequentially positioned along the microfluidic volume;
the first sub volume is coated by the freeze-dried reaction agent;
the microfluidic reaction system further comprises a second freeze-dried reaction agent, different than the first freeze-dried reaction agent; and
the second sub volume is coated by the second freeze-dried reaction agent.

8. The microfluidic reaction system of claim 1 further comprising:
an orifice through which fluid is ejected from the microfluidic volume; and
a fluid actuator proximate the orifice to eject fluid through the orifice.

9. The microfluidic reaction system of claim 1, wherein the freeze-dried reaction agent has a first concentration in a first portion of the microfluidic volume and a second concentration, greater than the first concentration, in a second portion of the microfluidic volume.

10. The microfluidic reaction system of claim 1, wherein the freeze-dried reaction agent has a first surface area in a first portion of the microfluidic volume and a second surface area, greater than the first surface area, in a second portion of the microfluidic volume.

11. The microfluidic reaction system of claim 1, wherein the freeze-dried reaction agent has a first density in a first portion of the microfluidic volume and a second density, greater than the first density, in a second portion of the microfluidic volume.

12. The microfluidic reaction system of claim 1, further comprising:
a heater supported by the microfluidic die to heat fluid in the microfluidic volume; and
wherein the freeze-dried reaction agent comprises one of an optical indicator and an electrochemical detection agent.

13. The microfluidic reaction system of claim 1, wherein the microfluidic volume comprises multiple branching microfluidic channels, the system further comprising a controller to operate a valve and pump in the microfluidic die to selectively direct the fluid to different locations of the freeze-dried reaction agent within the multiple branching microfluidic channels.

14. A microfluidic reaction system comprising:
a microfluidic die comprising a microfluidic volume comprising a microfluidic channel having a dimension on an order of 10 microns;
a port connected to the microfluidic volume for receiving a fluid;
a freeze-dried reaction agent coating at least a portion of the microfluidic volume; and
a proud structure rising within the microfluidic volume;
the freeze-dried reaction agent disposed on an upper surface of the proud structure, and an electrical resistor supported by the proud structure.

15. The microfluidic reaction system of claim 14, further comprising the freeze-dried reaction agent disposed also on side surfaces of the proud structure.

16. A method of making the microfluidic reaction system of claim 1, the method comprising:
forming a microfluidic volume in a microfluidic die;
forming a proud structure rising from a floor of the microfluidic volume;
introducing a reaction agent into the microfluidic volume; and
freeze-drying the reaction agent within the microfluidic volume to coat external surfaces of the proud structure that face the microfluidic volume, the freeze-drying comprising:
freezing the reaction agent during a first freezing period; and drying the reaction agent during two drying periods, a first drying period having a lower temperature than a second drying period.

17. The method of claim 16, wherein the reaction agent comprises at least one of a coagulation agent, an optical indicator and an electrochemical detection agent.

18. The method of claim 16:
wherein the microfluidic volume comprises branching microfluidic channels; and
the method further comprises, with a controller of the microfluidic die, operating valves and pumps in the microfluidic channels of the microfluidic volume to direct the introduced reaction agent to locations where the reaction agent is to be freeze-dried.

19. The method of claim 16, further comprising freezing the reagent during a second freezing period wherein:
the first freezing period is conducted for 30-45 minutes at −50° C. and 670 Torr; and
the second freezing period is conducted for 5 minutes or less at −50° C. and 470 Torr.

20. The method of claim 19, further comprising, following the second freezing period, reducing a pressure to 200 mTorr while setting temperature at −50° C., wherein:
the first drying period is 840 minutes at 10° C. and 100 mTorr; and
the second drying period is 240 minutes at 20° C. and 100 mTorr.

* * * * *